United States Patent
Lin et al.

(10) Patent No.: US 9,548,774 B2
(45) Date of Patent: Jan. 17, 2017

(54) SIGNAL GENERATOR WITH IMAGE REJECTION

(71) Applicant: QUALCOMM Incorporated, San Diego, CA (US)

(72) Inventors: Saihua Lin, Santa Clara, CA (US); Jianlei Shi, Milpitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/625,973

(22) Filed: Feb. 19, 2015

(65) Prior Publication Data
US 2016/0248460 A1    Aug. 25, 2016

(51) Int. Cl.
H04B 1/10    (2006.01)
H04B 1/00    (2006.01)
H03B 21/01   (2006.01)

(52) U.S. Cl.
CPC ............ H04B 1/1018 (2013.01); H03B 21/01 (2013.01); H04B 1/0082 (2013.01)

(58) Field of Classification Search
CPC ................. H04L 25/03038; H04L 27/2647
USPC .................................................. 375/350, 347
See application file for complete search history.

(56) References Cited

U.S. PATENT DOCUMENTS

| | | | |
|---|---|---|---|
| 4,127,846 A * | 11/1978 | Mori | H04W 88/027 340/13.28 |
| 7,212,588 B1 * | 5/2007 | Wong | H03D 3/007 370/342 |
| 7,299,006 B1 * | 11/2007 | Rofougaran | H03D 3/244 323/267 |
| 7,459,946 B2 * | 12/2008 | Bollenbeck | H03J 7/065 327/116 |
| 7,477,886 B1 | 1/2009 | Wong | |
| 7,970,372 B2 | 6/2011 | Watanabe | |
| 8,138,761 B2 | 3/2012 | Evans | |
| 8,532,601 B2 | 9/2013 | Tuttle et al. | |
| 8,699,985 B1 * | 4/2014 | Mar | G06F 1/0328 455/209 |
| 8,723,568 B1 | 5/2014 | Terrovitis | |
| 8,805,309 B2 | 8/2014 | Leenaerts et al. | |

(Continued)

OTHER PUBLICATIONS

Ghaffari A., et al., "Tunable N-Path Notch Filters for Blocker Suppression: Modeling and Verification", IEEE Journal of Solid-State Circuits, IEEE Service Center, Piscataway, NJ, USA, vol. 48, No. 6, Jun. 1, 2013 (Jun. 1, 2013), pp. 1370-1382, XP011510718, ISSN: 0018-9200, DOI: 10.1109/JSSC.2013.2252521 the whole document.

(Continued)

*Primary Examiner* — Helene Tayong
(74) *Attorney, Agent, or Firm* — Paradice and Li LLP

(57) ABSTRACT

A method and apparatus are disclosed for generating a quadrature signal that may be used to modulate and/or demodulate communication signals transmitted between communication devices. A quadrature signal generator may include a control block, a mixer, and a filter. The control block may generate a reference signal and a filter control signal based on an input clock signal. The mixer may generate a mixer output signal based on the input clock signal and the reference signal. The filter, controlled by the filter control signal, may filter the mixer output signal to suppress a band of frequencies within the mixer output signal.

15 Claims, 8 Drawing Sheets

(56) References Cited

U.S. PATENT DOCUMENTS

| | | |
|---|---|---|
| 2003/0008628 A1* | 1/2003 | Lindell .............. H03J 3/08 |
| | | 455/180.1 |
| 2003/0232613 A1* | 12/2003 | Kerth ............ H04B 1/0003 |
| | | 455/323 |
| 2004/0062216 A1* | 4/2004 | Nicholls ............. H04B 1/71 |
| | | 370/320 |
| 2006/0111071 A1* | 5/2006 | Paulus .............. H04B 1/30 |
| | | 455/302 |
| 2006/0246861 A1* | 11/2006 | Dosanjh .......... H03B 21/00 |
| | | 455/147 |
| 2007/0153878 A1* | 7/2007 | Filipovic ........ H04B 1/1036 |
| | | 375/147 |
| 2008/0003968 A1 | 1/2008 | Li |
| 2009/0086844 A1 | 4/2009 | Rofougaran |
| 2010/0271106 A1 | 10/2010 | Deguchi et al. |
| 2014/0079098 A1* | 3/2014 | Harjani ............ H04B 1/001 |
| | | 375/219 |

OTHER PUBLICATIONS

International Search Report and Written Opinion—PCT/US2016/017016—ISA/EPO—May 13, 2016.

* cited by examiner

SIGNAL GENERATOR WITH IMAGE REJECTION

TECHNICAL FIELD

The present embodiments relate generally to communication systems, and specifically to generating quadrature clock signals for use in a communication system while suppressing unwanted signals that may be included with the quadrature clock signals.

BACKGROUND OF RELATED ART

Communication devices may transmit and receive communication data through a communication medium. In one example, the communication medium may be a wireless communication medium where the communication data (e.g., radio frequency signal) is transmitted and received by communication devices according to a wireless communication protocol. Example wireless communication protocols may include IEEE 802.11 protocols and Bluetooth protocols according to the Bluetooth Special Interest Group. In another example, the communication medium may be a wired communication medium where the communication data is transmitted and received according to a wire-based communication protocol. Some example wire-based protocols may include an Ethernet® protocol and/or a Powerline Communications protocol described by the HomePlug 2.0 specification. In yet another example, the communication medium may be a hybrid combination of both wired and wireless communication mediums.

Some communication protocols may use quadrature signals to transmit and/or receive the communication data through the communication medium. For example, a communication protocol may use an in-phase (I) clock signal and a quadrature (Q) clock signal (sometimes referred to as a local oscillator signal) to encode and/or decode the communication data. In some communication devices, the generated I and Q clock signals may include one or more unwanted signals that may interfere with the performance of the communication device. For example, unwanted harmonics of the I and Q clock signals may undesirably couple into a sensitive receive and/or transmit circuit and interfere with the transmission and/or reception of the communication data.

Thus, there is a need to improve the generation of signals (such as I and Q clock signals) and suppress and/or reduce unwanted signals associated therewith to improve the performance of the communication device.

SUMMARY

This summary is provided to introduce in a simplified form a selection of concepts that are further described below in the detailed description. This summary is not intended to identify key features or essential features of the claimed subject matter, nor is it intended to limit the scope of the claimed subject matter.

A signal generator is disclosed that generates a quadrature signal and suppresses a predetermined band of frequencies. In one embodiment, the signal generator may include a control block, a mixer, and a filter. The control block may generate a reference signal and a filter control signal. The filter control signal may be based, at least in part, on an input clock signal. In some embodiments, the filter control signal may include a number N of individual control signals. The mixer, coupled to the control block, may generate a mixer output signal based, at least in part, on the input clock signal and the reference signal. The filter, coupled to the mixer and the control block, may filter the mixer output signal and generate a filter output signal based, at least in part, on the filter control signal.

A wireless device is disclosed that includes a base-band processing unit and a transceiver. The base-band processing unit may process communication data. The transceiver, coupled to the base-band processing unit, may transmit the communication data. The transceiver may include a control block, a mixer, and a filter. The control block may generate a reference signal and a filter control signal having a number N of individual control signals based on an input clock signal. The mixer, coupled to the control block, may generate a mixer output signal based, at least in part, on the input clock signal and the reference signal. The filter, coupled to the mixer and the control block, may filter the mixer output signal and generate a filter output signal based on the filter control signal.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

The example embodiments are described below in the context of Wi-Fi enabled devices for simplicity only. It is to be understood that the present embodiments are equally applicable for devices using signals of other various wireless standards or protocols (e.g., cellular signals such as LTE, GSM, and UMTS signals). As used herein, the terms "wireless local area network (WLAN)" and "Wi-Fi" can include communications governed by the IEEE 802.11 standards, BLUETOOTH®, HiperLAN (a set of wireless standards, comparable to the IEEE 802.11 standards, used primarily in Europe), and other technologies used in wireless communications (e.g., ZigBee and WiGig). The example embodiments may also be used with wired standards including, for example, Ethernet, Powerline Communication, HomePlug, and any other feasible wired technology.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Figure 1:
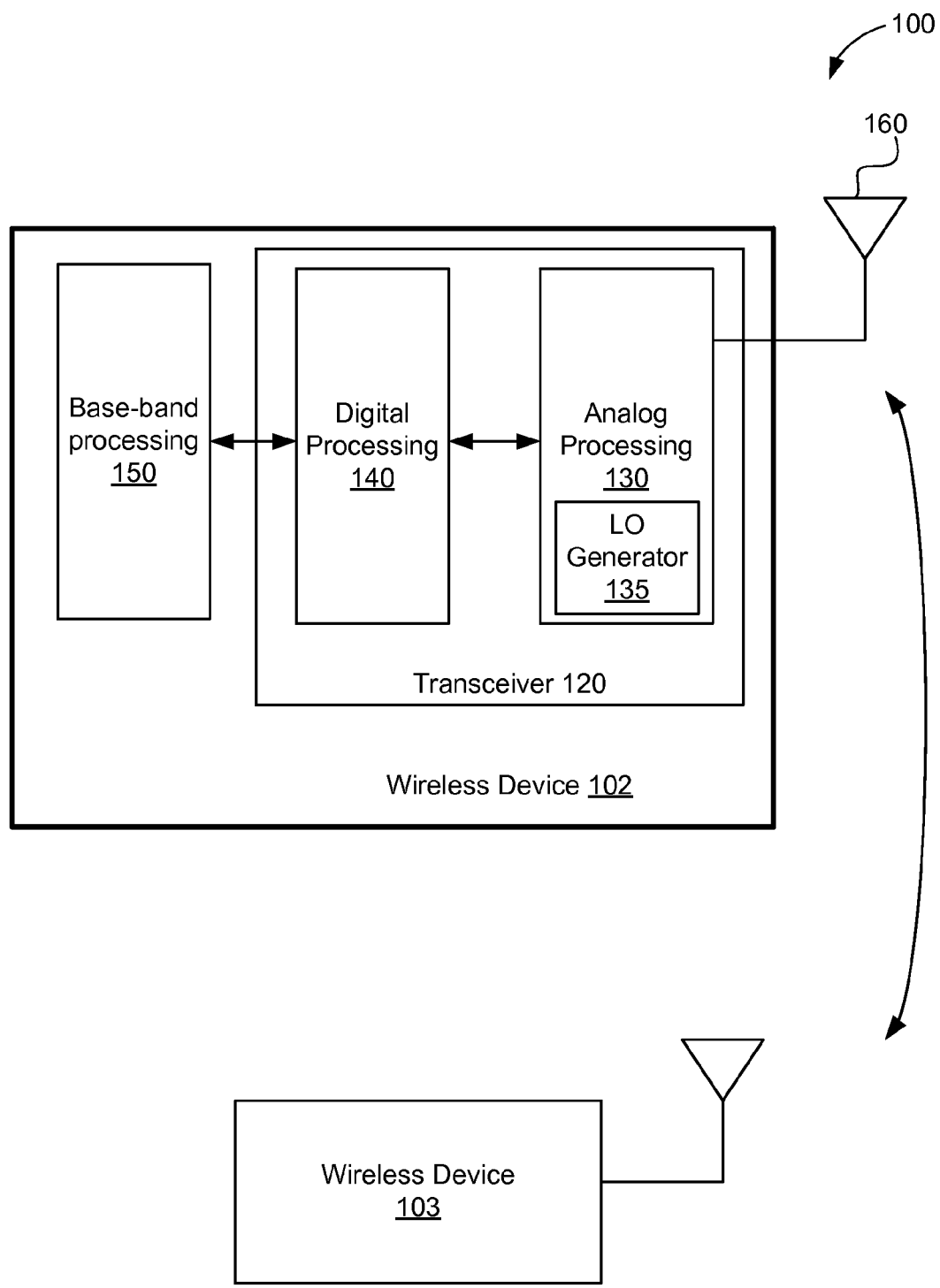
FIG. 1 depicts an example communication system within which example embodiments may be implemented.

FIG. 1 depicts an example communication system 100 within which example embodiments may be implemented. Communication system 100 may be a wireless system and may include wireless device 102 and wireless device 103. Although only two wireless devices 102 and 103 are shown for simplicity, communication system 100 may include any number of wireless devices. In other embodiments, communication system 100 may be a wired system and may include wired devices coupled to a wire or cable (not shown for simplicity). In still other embodiments, communication system 100 may be a hybrid system and may include both wireless and wired communication devices.

Wireless device 102 may include a transceiver 120, a base-band processing unit 150, and an antenna 160. Although not shown for simplicity, wireless device 102 may include a plurality of antennas. Base-band processing unit 150 may provide data to be transmitted to and/or receive data from one or more other devices via transceiver 120 and antenna 160. For example, base-band processing unit 150 may encode and/or decode the communication data for transmission and/or reception by transceiver 120.

Transceiver 120 may include a digital processing unit 140 coupled to an analog processing unit 130. Transceiver 120 may receive the communication data from and provide the communication data to base-band processing unit 150 via digital processing unit 140 and analog processing unit 130. In some embodiments, the communication data may be processed according to a wireless communication protocol such as Wi-Fi, BLUETOOTH, near-field communication, Zig-Bee, or any other feasible wireless communication protocol. In other embodiments, the communication data may be processed according to a wired protocol such as an Ethernet, Powerline Communication, or any other feasible wired communication protocol. In still other embodiments, the communication data may be processed according to both a wireless and a wired communication protocol.

In some embodiments, digital processing unit 140 may transform the communication data by, for example, performing a Fast Fourier Transform or an Inverse Fast Fourier Transform on the communication data signals. Analog processing unit 130 may modulate and/or demodulate the communication data according to a selected communication protocol. Analog processing unit 130 may include a local oscillator (LO) signal generator 135 to generate a LO (I) (in-phase) signal and a LO (Q) (quadrature) signal used for data modulation/demodulation. In some embodiments, the LO (I) signal and the LO (Q) signal may be related by a 90 degree phase shift, and may be based on a signal provided by a local oscillator (not shown for simplicity). Operation of LO signal generator 135 is described in more detail below in conjunction with FIGS. 2A and 2B. Wireless device 103 may include a transceiver and a base-band processing unit (not shown for simplicity) similar to those depicted in wireless device 102 (as well as one or more antennas 160).

Figure 2A:
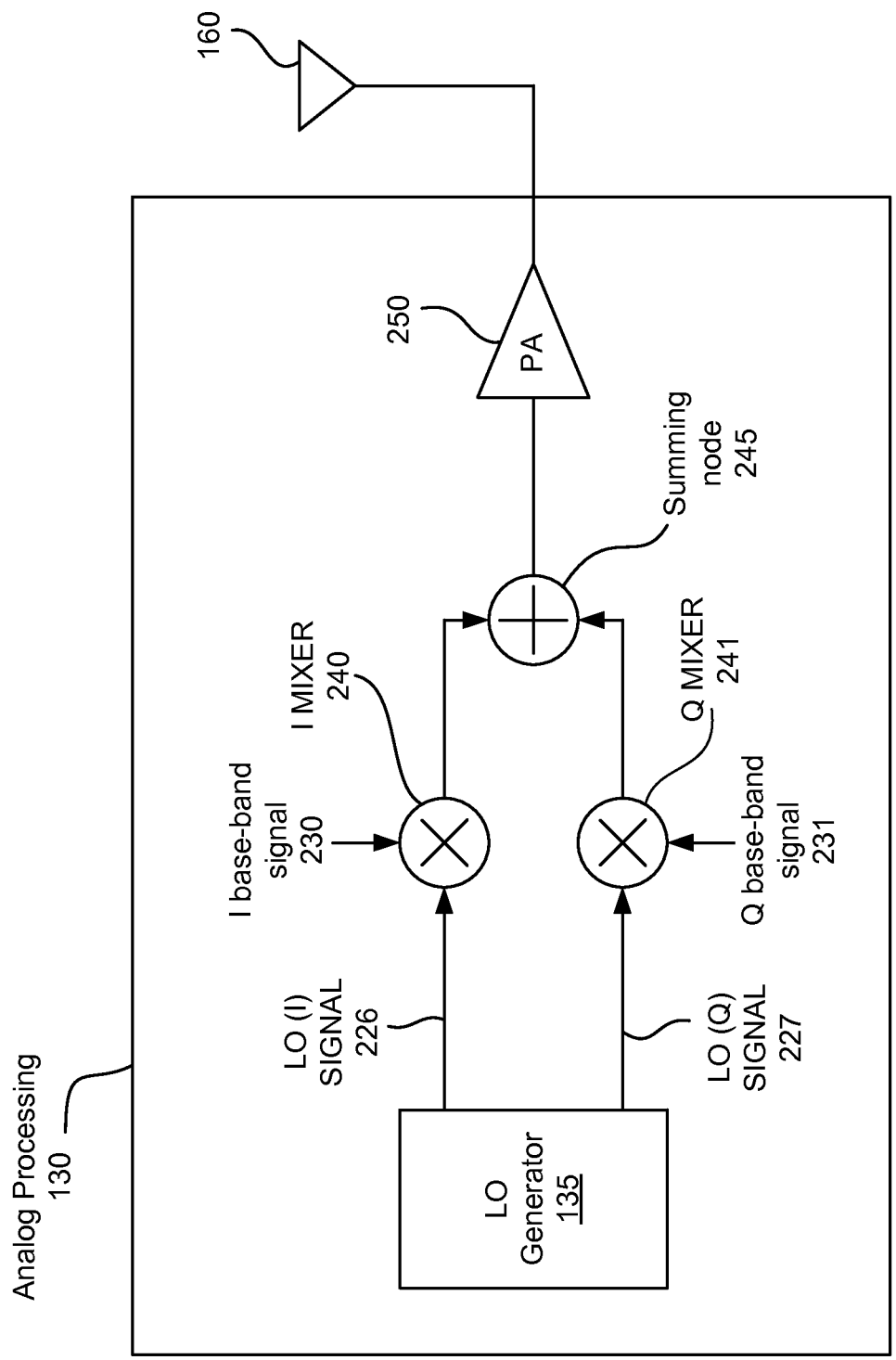
FIG. 2A shows an example block diagram of an analog processing unit of FIG. 1, in accordance with some embodiments.

FIG. 2A shows an example block diagram of analog processing unit 130 of FIG. 1, in accordance with some embodiments. Analog processing unit 130 may include LO signal generator 135, an I mixer 240, a Q mixer 241, a summing node 245, and a power amplifier 250. LO signal generator 135 may generate a LO (I) signal 226 and a LO (Q) signal 227. In some embodiments, LO (I) signal 226 and LO (Q) signal 227 may have a frequency associated with a carrier frequency. LO (I) signal 226 may be coupled to I mixer 240. I mixer 240 may "mix" (e.g., multiply two signals together) LO (I) signal 226 and an I base-band signal 230 received from base-band processing unit 150 of FIG. 1. In a similar manner, Q mixer 241 may mix together LO (Q) signal 227 and a Q base-band signal 231 received from base-band processing unit 150 of FIG. 1. Outputs from I mixer 240 and Q mixer 241 may be summed together by summing node 245 to generate a signal, such as a radio frequency (RF) signal, that may be transmitted to another wireless device. The RF signal may amplified by power amplifier 250 before being transmitted through antenna 160.

Figure 2B:
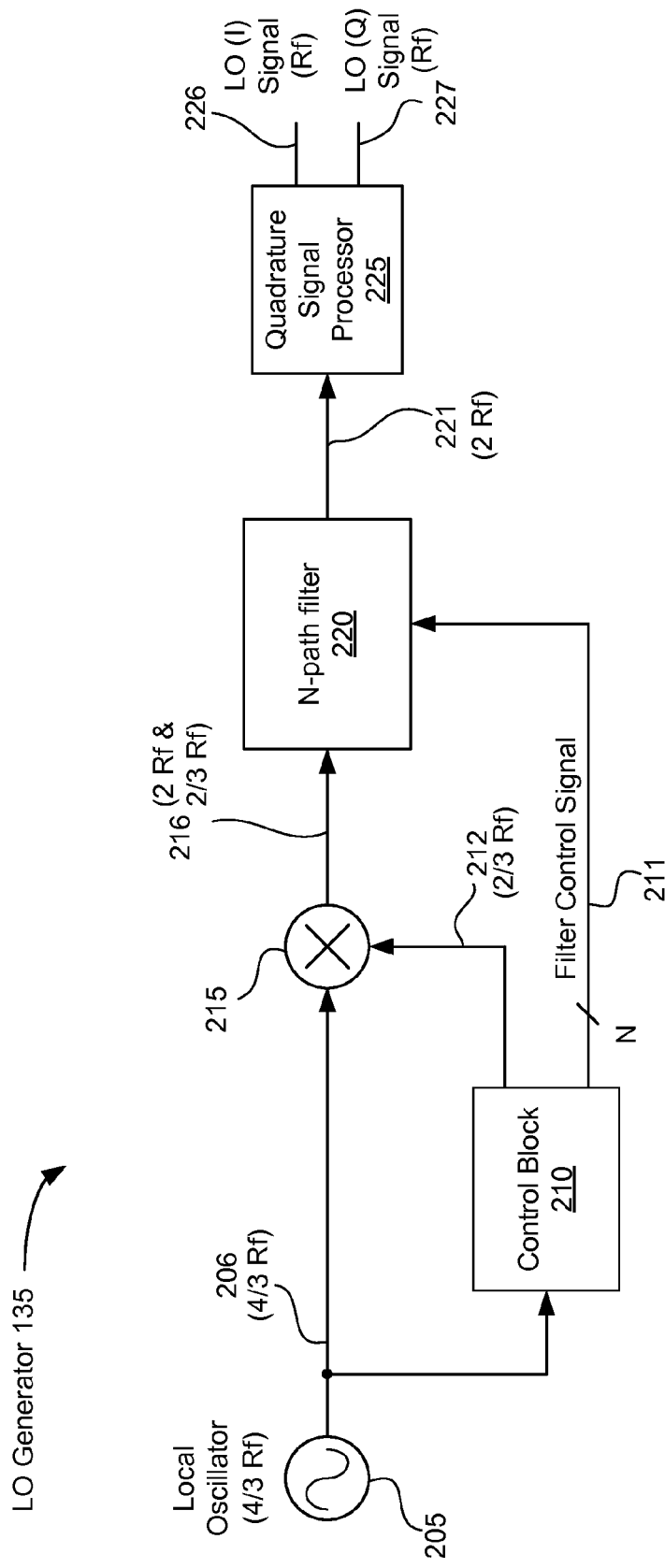
FIG. 2B shows an example block diagram of a LO signal generator of FIG. 1, in accordance with some embodiments.

FIG. 2B shows an example block diagram of LO signal generator 135 of FIG. 1, in accordance with some embodiments. LO signal generator 135 may include a local oscillator (LO) 205, a control block 210, a mixer 215, an N-path filter 220, and a quadrature signal processor 225. In some embodiments, LO 205 may be a configurable crystal-based frequency synthesizer. For example, LO 205 may be configured to generate a LO output signal 206 having a frequency associated with the carrier frequency. In some embodiments, LO output signal 206 may be a differential signal. The LO 205 is coupled to control block 210 and mixer 215.

Control block 210 may generate a reference signal 212 and a filter control signal 211. Reference signal 212, provided to mixer 215, may be a divided down (e.g., reduced in frequency) version of LO output signal 206. For example, if LO output signal 206 is a clock signal having a frequency of F MHz, then reference signal 212 may have a frequency of F/2 MHz. In other embodiments, the frequency of reference signal 212 may be related to the frequency of LO output signal 206 by any rational number. In some embodiments, reference signal 212 may have a duty cycle of approximately 50%, and/or may be a differential signal.

Filter control signal 211 may include a number N of individual control signals. Each individual control signal may have a pulse with a pulse width similar to a pulse width of LO output signal 206. Pulses included within each individual control signal may be staggered with respect to each another. Individual control signals associated with filter control signal 211 are described in more detail below in conjunction with FIG. 3.

Mixer 215 may mix together LO output signal 206 and reference signal 212, and generate a mixer output signal 216. Persons skilled in the art will appreciate that mixer output signal 216 may include a first signal having a frequency equal to the frequency of LO output signal 206 plus the frequency of reference signal 212 and include a second signal having a frequency equal to the frequency of LO output signal 206 minus the frequency of reference signal 212. In some embodiments, either the first signal or the second signal may be considered an unwanted signal and/or mixer output signal 216 may be a differential signal.

N-path filter 220, coupled to mixer 215 and control block 210, may filter mixer output signal 216 to suppress and/or remove unwanted signals. For example, N-path filter 220 may suppress and/or remove the first signal or the second signal. Thus, N-path filter output signal 221 may include the first signal with a suppressed second signal or the second signal with a suppressed first signal. In some embodiments, a frequency response of N-path filter 220 may be determined by filter control signal 211, and/or N-path filter output signal 221 may be a differential signal.

Quadrature signal processor 225 is coupled to N-path filter 220. Quadrature signal processor 225 may generate LO (I) signal 226 and LO (Q) signal 227 based on N-path filter output signal 221. In some embodiments, LO (Q) signal 227 may be related to LO (I) signal 226 by a 90 degree phase shift and may be used to encode and/or decode the communication data. For example, LO (I) signal 226 and LO (Q) signal 227 may be used to up-convert (encode) or down-convert (decode) the communication data via one or more mixers (not shown for simplicity).

Frequency of LO (I) signal 226 and LO (Q) signal 227 may be based on the frequency of LO output signal 206, the frequency of reference signal 212, and the frequency response of N-path filter 220. In some embodiments, the frequency of LO output signal 206 is $4/3$ of a desired frequency of LO (I) signal 226 and LO (Q) signal 227 frequency (e.g., $4/3$ Rf, where Rf may be the desired frequency of LO (I) signal 226 and LO (Q) signal 227 frequency) and reference signal 212 may be a half-rate (divide by 2) version of LO output signal 206 (e.g., $2/3$ Rf). Thus, mixer output signal 216 may include at least two signals (e.g., a first signal with a frequency of $4/3$ Rf+$2/3$ Rf=2 Rf and a second signal with a frequency of $4/3$ Rf−$2/3$ Rf=$2/3$ Rf). However, only one of the two signals may be used to generate the LO (I) signal 226 and LO (Q) signal 227. The other signal may be an unwanted harmonic signal.

N-path filter 220 may suppress one of the first signal and the second signal from mixer output signal 216, and thereby suppress the unwanted harmonic signal. For example, if the first signal (2 Rf) is to be used to generate LO (I) signal 226 and LO (Q) signal 227, then N-path filter 220 may suppress the second signal ($2/3$ Rf). In another example, if the second signal ($2/3$ Rf) is to be used to generate LO (I) signal 226 and LO (Q) signal 227, then N-path filter 220 may suppress the first signal (2 Rf). In some embodiments, the suppressed unwanted harmonic signal may be determined, at least in part, by filter control signal 211. For example, if the first signal (2 Rf) and the second signal ($2/3$ Rf) are received by N-path filter 220, and filter control signal 211 has a frequency of $2/3$ Rf, then N-path filter 220 may suppress the second signal ($2/3$ Rf) based on the filter control signal 211. In other embodiments, other frequencies of filter control signal 211 may cause N-path filter 220 to suppress different frequencies. Operation of N-path filter 220 is described in more detail below in conjunction with FIG. 3.

In some embodiments, the first signal (2 Rf) may be divided by 2 (e.g., within quadrature signal processor 225) to generate the LO (I) signal 226 and LO (Q) signal 227. LO (I) signal 226 and LO (Q) signal 227 generation is described in more detail below in conjunction with FIG. 5.

Figure 3:
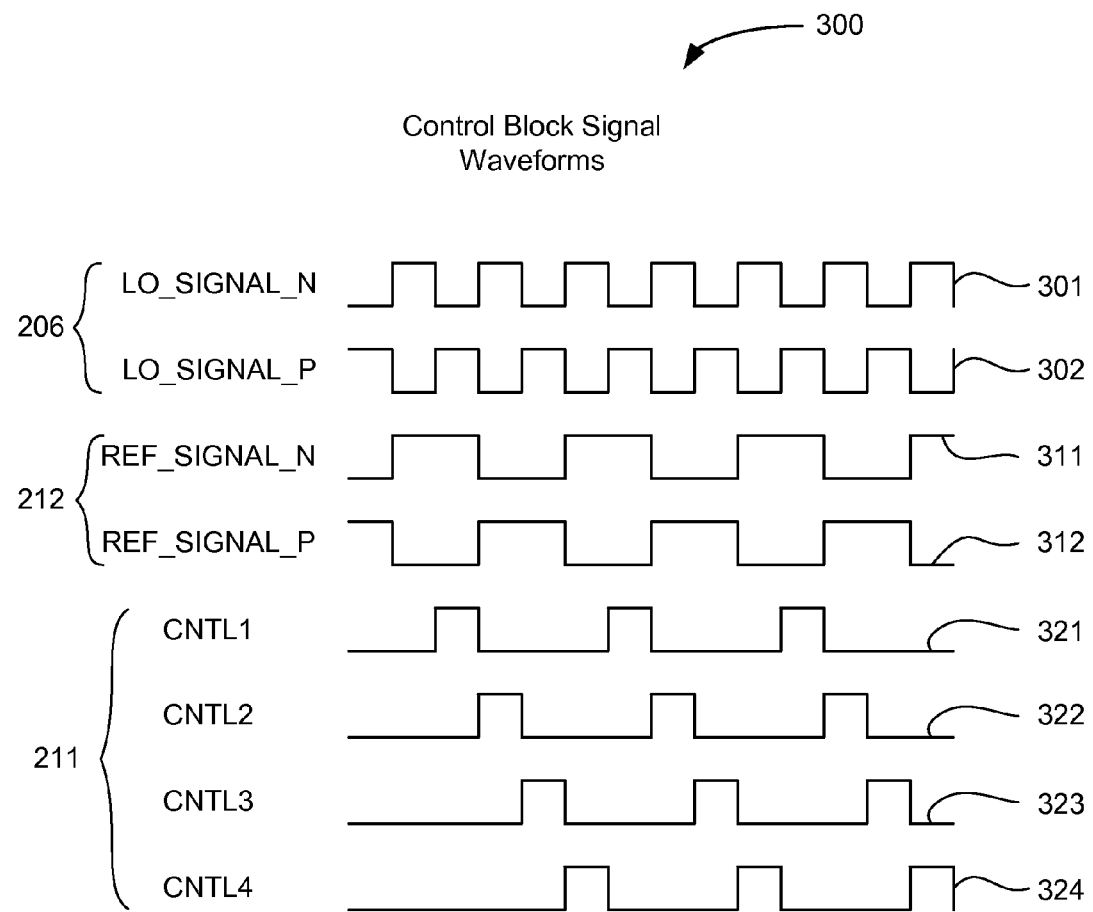
FIG. 3 shows a waveform diagram of signals associated with the control block of FIG. 2, in accordance with some embodiments.

FIG. 3 shows a waveform diagram 300 of signals associated with control block 210, in accordance with some embodiments. LO output signal 206 may be received by control block 210. In some embodiments, LO output signal 206 may include LO_SIGNAL_N 301 and LO_SIGNAL_P 302 (e.g., when LO output signal 206 is a differential signal).

Control block 210 may generate reference signal 212. In some embodiments, reference signal 212 may be a differential signal based on LO output signal 206. In some embodiments, reference signal 212 may include REF_SIGNAL_N 311 and REF_SIGNAL_P 312 and may transition on rising edges of LO_SIGNAL_N 301 and/or falling edges of LO_SIGNAL_P 302 as shown in FIG. 3. In another embodiment, REF_SIGNAL_N 311 and REF_SIGNAL_P 312 may transition on falling edges of LO_SIGNAL_N 301 and/or rising edges of LO_SIGNAL_P 302 (not shown for simplicity). Although reference signal 212 is depicted as a half-rate (e.g., divided by two) version of LO output signal 206, in other embodiments, reference signal 212 may be related to LO output signal 206 by any technically feasible rational number. For example, reference signal 212 may be a quarter rate (e.g., divided by four) version of LO output signal 206.

Control block 210 may also generate filter control signal 211 for N-path filter 220. In some embodiments, filter control signal 211 may include N individual control signals. For example, if N=4, then filter control signal 211 may include four individual control signals CNTL1 321, CNTL2 322, CNTL3 323, and CNTL4 324 as shown in FIG. 3. In some embodiments, each individual control signal may have a duty cycle of (1/N*100) percent. Thus, when N=4, the duty cycle of each control signal may be 25 percent. In some embodiments, each individual control signal may have a pulse width approximately equal to a pulse width of LO output signal 206. In some embodiments, pulses associated with each individual control signal CNTL may not overlap, and may cyclically (periodically) repeat. Example waveforms of CNTL1 321, CNTL2 322, CNTL3 323, and CNTL4 324 are shown in FIG. 3. In one embodiment, CNTL1 321 may align with, and have a pulse width associated with LO_SIGNAL_P 302, as shown in FIG. 3. In another embodiment, CNTL1 321 may align with, and have a pulse width associated with LO_SIGNAL_N 301 (not shown for simplicity). Filter control signal 211 may be generated using any technically feasible means such as hardware (gates, flops, inverters, etc.), software, firmware, or a combination thereof.

Figure 4:
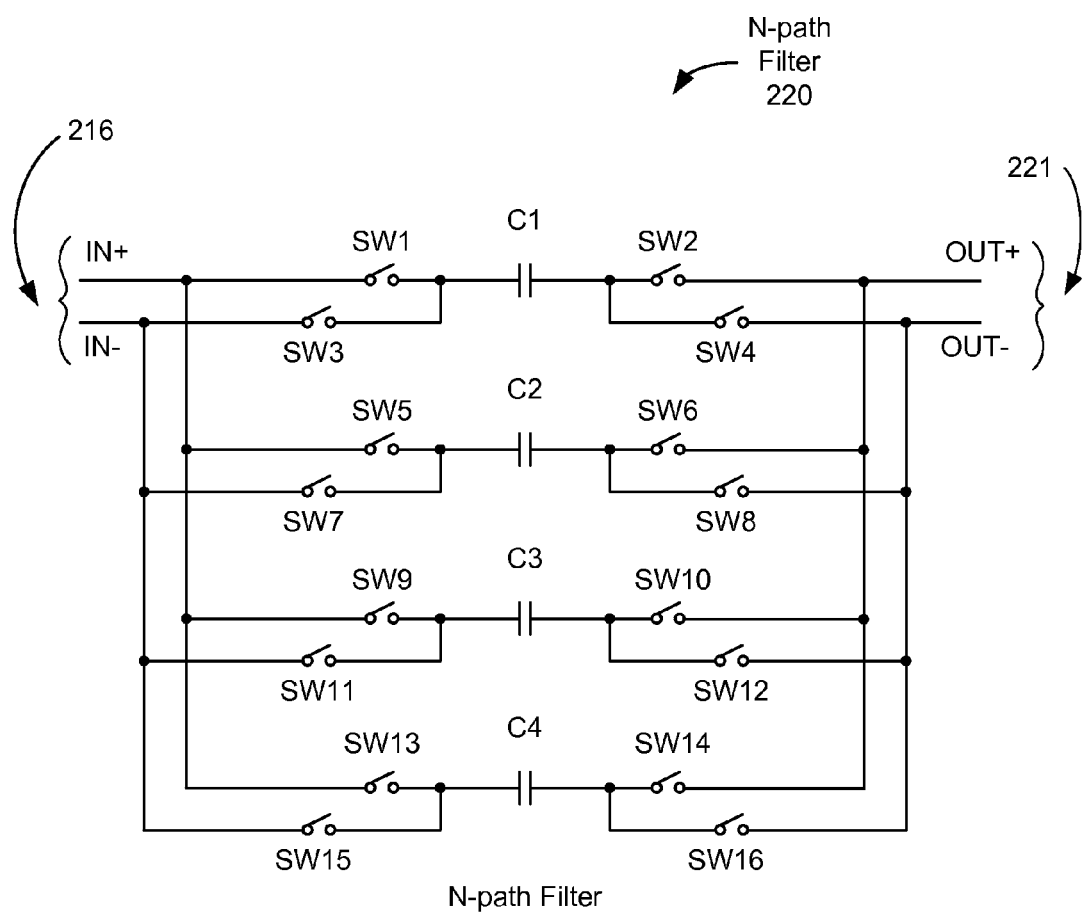
FIG. 4 shows a simplified schematic diagram of the N-path filter of FIG. 2, in accordance with some embodiments.

FIG. 4 shows a simplified schematic diagram of N-path filter 220, in accordance with some embodiments. As described above, N-path filter 220 may receive mixer output signal 216 from mixer 215 (see FIG. 2B). In some embodiments, mixer output signal 216 may be a differential signal denoted as IN+ and IN− in FIG. 4. N-path filter 220 may suppress a band of frequencies included within mixer output signal 216. In some embodiments, N-path filter 220 may operate as a notch filter, a low pass filter, a high pass filter, a band pass filter, or any other technically feasible filter. In some embodiments, N-path filter output signal 221 may be a differential signal denoted as OUT+ and OUT− in FIG. 4.

N-path filter 220 may include N pathways, each pathway including a capacitor. For example, if N=4, then N-path filter 220 may include 4 pathways and 4 capacitors C1-C4. In one embodiment, capacitors C1-C4 may have a value of 1 pF. In other embodiments, capacitors C1-C4 may have any other technically feasible value to provide a desired frequency response. In some embodiments, the number N may be consistent with the number of individual control signals generated by control block 210. For the example embodiment of FIG. 4, each pathway may include 4 switches that may be controlled by filter control signal 211. For example, capacitor C1 may be coupled to switches SW1-SW4. Although shown as a simple switch in FIG. 4, switches SW1-SW4 may be any technically feasible switch units such as, for example, silicon switches, bipolar, and/or CMOS transistors. As shown, switches SW1 and SW3 may be coupled to a first terminal of capacitor C1 and switches SW2 and SW4 may be coupled to a second terminal of capacitor C1. Switches SW1 and SW3 may also be coupled in parallel to respective input terminals of N-path filter 220, and switches SW2 and SW4 may also be coupled in parallel to respective output terminals of N-path filter 220. In a similar 1manner, capacitor C2 may be coupled to switches SW5-SW8, capacitor C3 may be coupled to switches SW9-SW12, and capacitor C4 may be coupled to switches SW13-SW16. Each switch SW1-SW16 may be controlled by at least one of the individual control signals provided as filter control signal 211. Table 1 below describes one possible association between filter control signal 211 (e.g., CNTL1-CNTL4) and switches SW1-SW16.

TABLE 1

| Filter Control Signal | Switch |
|---|---|
| CNTL1 | SW1, SW2, SW11, and SW12 |
| CNTL2 | SW5, SW6, SW15, and SW16 |
| CNTL3 | SW3, SW4, SW9, and SW10 |
| CNTL4 | SW7, SW8, SW13, and SW14 |

In some embodiments, N-path filter 220 may operate as a notch filter and may suppress an unwanted frequency band by selectively coupling two or more of capacitors C1-C4 between mixer 215 and quadrature signal processor 225. In some embodiments, capacitors C1-C4 may be implemented within a substrate supporting an integrated circuit. Thus, changes to the capacitive value of N-path filter 220 may track changes due to process, voltage, and/or temperature associated with an integrated circuit including transceiver 120.

Figure 5:
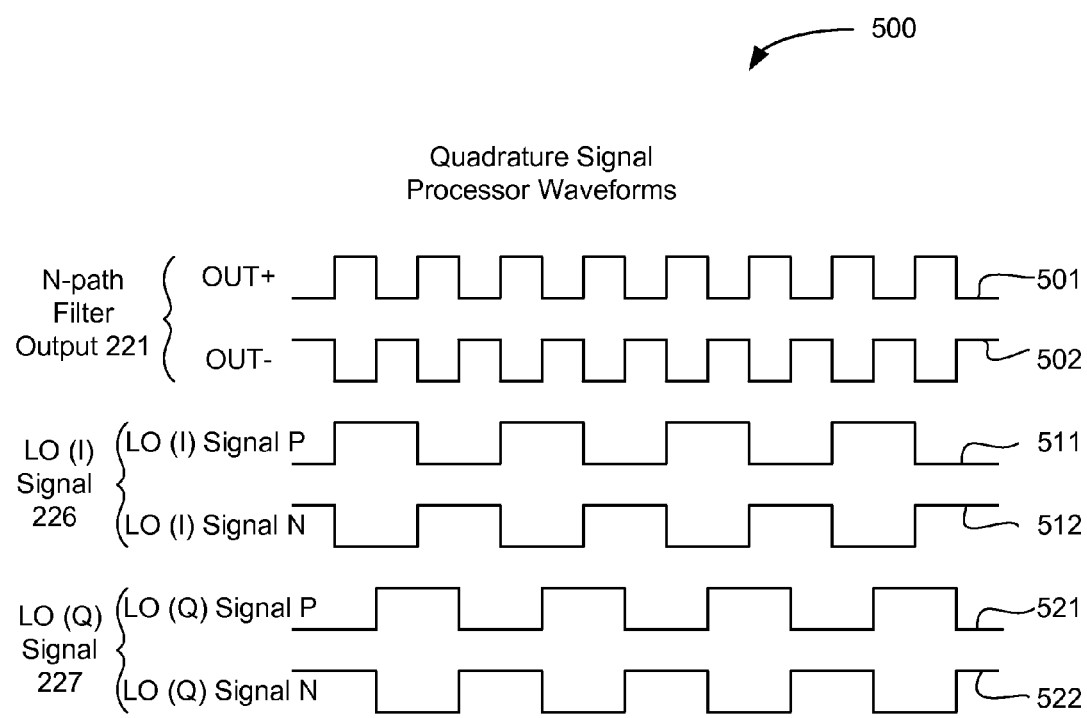
FIG. 5 shows a waveform diagram of signals associated with the quadrature signal processor of FIG. 2, in accordance with some embodiments.

FIG. 5 shows a waveform diagram 500 of signals associated with quadrature signal processor 225, in accordance with some embodiments. As described above in conjunction with FIG. 2B, quadrature signal processor 225 may receive N-path filter output signal 221. In some embodiments, N-path filter output signal 221 may be a differential signal as denoted by OUT+ 501 and OUT− 502 in FIG. 5. In some embodiments, the frequency of N-path filter output signal 221 may be twice the desired frequency of LO (I) signal 226 and LO (Q) signal 227.

Quadrature signal processor 225 may generate LO (I) signal 226 and LO (Q) signal 227 each has half the frequency of N-path filter output signal 221. In some embodiments, LO (I) signal 226 and LO (Q) signal 227 may be differential signals. For example, LO (I) signal 226 may include LO (I) signal P 511 and LO (I) signal N 512 (e.g., where LO (I) signal P 511 and LO (I) signal N 512 are logical complements of each other). Similarly, LO (Q) signal 227 may include LO (Q) signal P 521 and LO (Q) signal N 522 (e.g., where LO (Q) signal P 521 and LO (Q) signal N 522 are logical complements of each other).

LO (I) signal 226 may have a quadrature relationship to LO (Q) signal 227. For example, a rising edge of LO (I) signal P 511 may be associated with a rising edge of OUT+ 501 while a rising edge of LO (Q) signal P 521 may be associated with a falling edge of OUT+ 501 (or equivalently, a rising edge of OUT− 502). If OUT+ 501 has approximately a 50% duty cycle, then LO (Q) signal 227 is approximately 90 degrees shifted from LO (I) signal 226. LO (I) signal 226 and LO (Q) signal 227 may be generated with any technically feasible means such as hardware (gates, flops, inverters, etc.), software, firmware, or a combination thereof. In some embodiments, LO (I) signal 226 and LO (Q) signal 227 may be used to encode and/or decode communication data transmitted to and/or received from other wireless devices.

Figure 6:
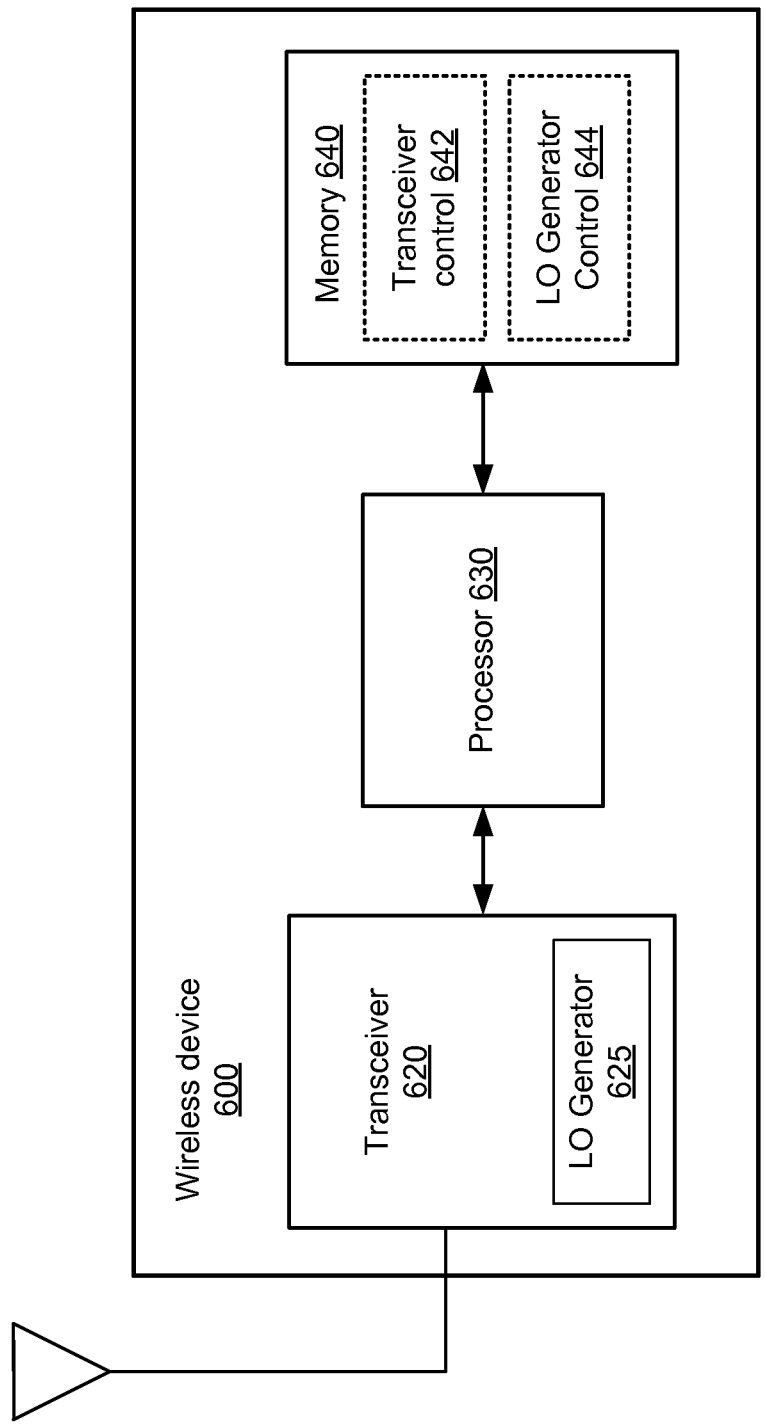
FIG. 6 shows a wireless device that may be one embodiment of the wireless devices of FIG. 1.

FIG. 6 shows a wireless device 600 that may be one embodiment of the wireless device 102 and 103 of FIG. 1. Wireless device 600 may include a transceiver 620, a processor 630, and a memory 640. The transceiver 620 may be used to transmit communication signals to and receive communication signals from other wireless devices. Transceiver 620 may include LO generator 625. In some embodiments, LO generator 625 may be one embodiment of LO signal generator 135 of FIGS. 1 and 2. LO generator 625 may generate LO (I) signal 226 and LO (Q) signal 227 (not shown for simplicity) that may be used by transceiver 620 to modulate and/or demodulate communication signals.

Memory 640 may include a non-transitory computer-readable storage medium (e.g., one or more nonvolatile memory elements, such as EPROM, EEPROM, Flash memory, a hard drive, etc.) that may store the following software modules:
- a transceiver control module 642 to control transceiver 620 to transmit and receive communication signals in accordance with one or more communication protocols; and
- a LO generator control module 644 to control operations associated with LO generator 625.

Each software module includes program instructions that, when executed by processor 630, may cause the wireless device 600 to perform the corresponding function(s). Thus, the non-transitory computer-readable storage medium of memory 640 may include instructions for performing all or a portion of the operations of FIG. 7.

Processor 630, which is coupled to transceiver 620 and memory 640, may be any one or more suitable processors capable of executing scripts or instructions of one or more software programs stored in the wireless device 600 (e.g., within memory 640).

Processor 630 may execute transceiver control module 642 to configure transceiver 620 to receive and/or transmit one or more communication signals in accordance with a communication protocol. For example, transceiver control module 642 may receive and/or transmit communication signals according to the IEEE 802.11 specification, a BLUETOOTH specification according to the Bluetooth Special Interest Group, a WiGig® specification, a ZigBee specification or any other technically feasible communication protocol.

Processor 630 may execute LO generator control module 644 to enable or disable generation of LO (I) signal 226 and/or LO (Q) signal 227 by LO generator 625. For example, processor 630 may control operation of N-path filter 220 (within LO generator 625) by controlling operation of control block 210. In some embodiments, processor 630 may configure filter control signal 211 to control a frequency response of N-path filter 220. In still other embodiments, processor 630 may control LO 205 (within LO generator 625) to generate a LO output signal 206 based on a desired carrier frequency for a communication signal.

Figure 7:
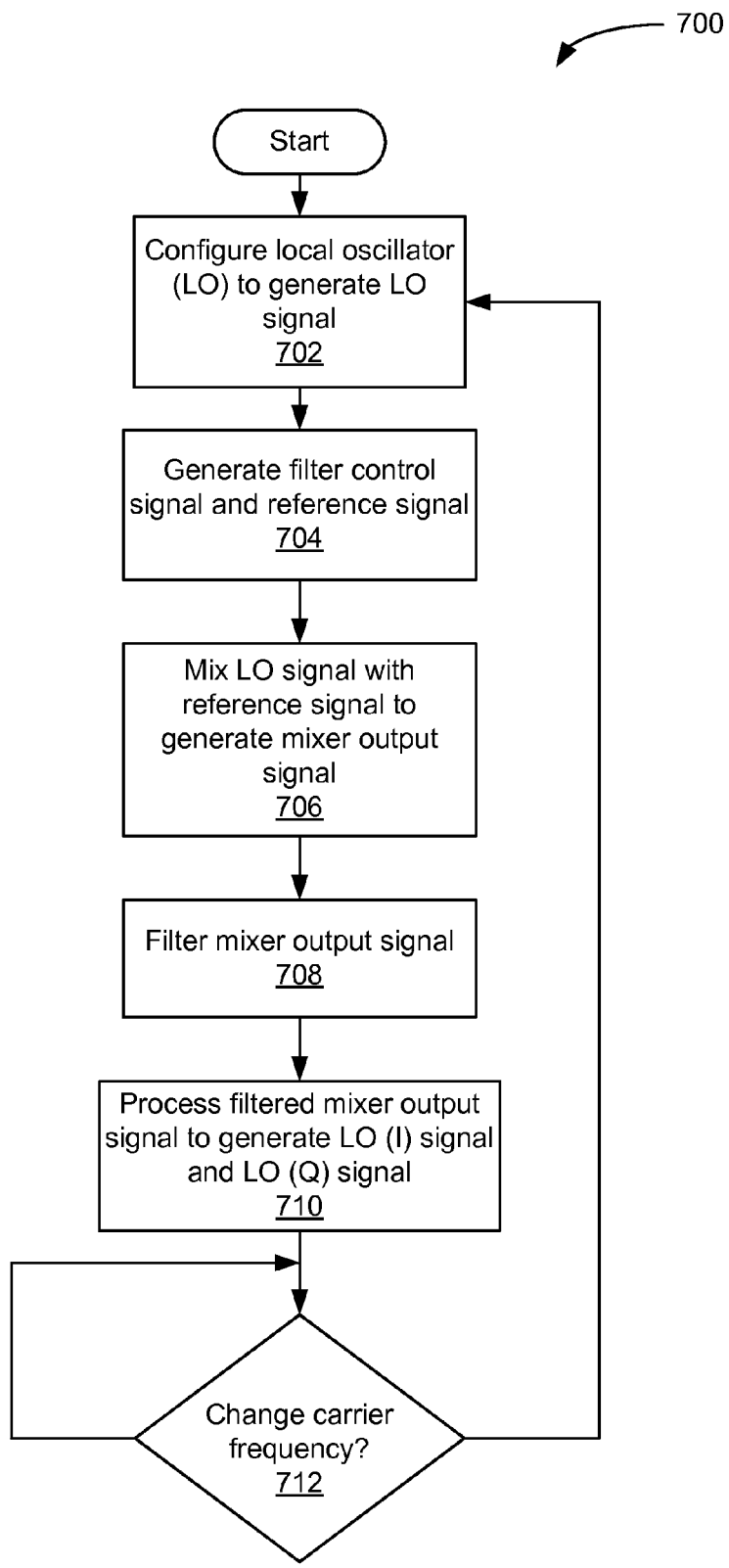
FIG. 7 shows an illustrative flow chart depicting an exemplary operation for generating a LO (I) signal and a LO (Q) signal, in accordance with some embodiments.

FIG. 7 shows an illustrative flow chart depicting an exemplary operation 700 for generating LO (I) signal 226 and LO (Q) signal 227, in accordance with some embodiments. Referring also to FIGS. 1 and 2, LO 205 is configured to generate LO output signal 206 (702). As described above in FIG. 2, LO output signal 206 may be used as a basis for a carrier frequency signal. Thus, LO 205 may be configured to generate LO output signal 206 having a frequency which, in turn, may be used to generate a desired carrier frequency signal. Next, filter control signal 211 for N-path filter 220 and reference signal 212 for mixer 215 are determined (704). In some embodiments, filter control signal 211 for N-path filter 220 may include N individual control signals based on LO output signal 206. For example, if the value of N is 4, then 4 individual control signals may be generated as described above in conjunction with FIGS. 2 and 3. Similarly, reference signal 212 for mixer 215 may be generated as described above in conjunction with FIGS. 2 and 3.

Next, LO output signal 206 is mixed with reference signal 212 to generate mixer output signal 216 (706). In some embodiments, when mixer 215 mixes together LO output signal 206 and reference signal 212, the resulting mixer output signal 216 may include a first signal based on the frequency of LO output signal 206 plus the frequency of reference signal 212, and a second signal based on the frequency of LO output signal 206 minus the frequency of reference signal 212. Next, mixer output signal 216 is filtered (708). In some embodiments, mixer output signal 216 may be filtered by N-path filter 220 controlled by filter control signal 211 to generate a filtered mixer output signal (e.g., N-path filter output signal 221). In one embodiment, N-path filter 220 may operate as a notch filter to suppress an unwanted signal within mixer output signal 216. For example, N-path filter 220 may suppress the second signal based on the frequency of LO output signal 206 minus the frequency of reference signal 212.

Next, the filtered mixer output signal (e.g., N-path filter output signal 221) is processed to generate LO (I) signal 226 and LO (Q) signal 227 (710). In some embodiments, N-path filter output signal 221 may be processed by quadrature signal processor 225. For example, LO (I) signal 226 and LO (Q) signal 227 may be generated by quadrature signal processor 225 based on N-path filter output signal 221 as described above in conjunction with FIG. 5. Next, a change of the carrier frequency is determined (712). If the carrier frequency is not to be changed, then no changes need to be made to LO 205 and operations return to 712. If the carrier frequency is to be changed (because, for example, a different communication channel is to be used), then operations continue to 702.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

The invention claimed is:

1. A quadrature signal generator, comprising:
a control block to generate a reference signal and a filter control signal, the filter control signal having a number N of individual control signals based, at least in part, on an input clock signal, wherein the number N is greater than one, wherein each of the N individual control signals has a pulse width approximately equal to a pulse width of the input clock signal and has a duty cycle of approximately 1/N times 100 (1/N*100) percent;
a mixer, coupled to the control block, to generate a mixer output signal based, at least in part, on the input clock signal and the reference signal; and
an N-path filter, coupled to the mixer and the control block, to filter the mixer output signal and to generate a filter output signal based, at least in part, on the filter control signal, the N-path filter comprising:
N capacitors and 2N (2*N) switch devices to selectively couple the N capacitors between an input of the N-path filter and an output of the N-path filter in response to the respective N individual control signals.

2. The quadrature signal generator of claim 1, wherein a frequency of the reference signal is one-half a frequency of the input clock signal.

3. The quadrature signal generator of claim 1, wherein the filter is to suppress, at least in part, signals having frequencies of approximately one-half a frequency of the input clock signal.

4. The quadrature signal generator of claim 1, wherein the filter is a notch filter to suppress a frequency band within the mixer output signal.

5. The quadrature signal generator of claim 1, further comprising:
a quadrature signal processor to receive the filter output signal and to generate a quadrature output signal having a first output signal and a second output signal, wherein the second output signal has a quadrature relationship to the first output signal.

6. The quadrature signal generator of claim 5, wherein a frequency of the first output signal and the second output signal is three-fourths (3/4) a frequency of the input clock signal.

7. The quadrature signal generator of claim 1, further comprising:
a local oscillator (LO) to generate the input clock signal having a frequency that is four-thirds (4/3) of a frequency of a quadrature output signal.

8. A wireless device comprising:
a base-band processing device to process communication data; and
a transceiver, coupled to the base-band processing device, to transmit the communication data, the transceiver comprising:
a control block to generate a reference signal and a filter control signal, the filter control signal having a number N of individual control signals based, at least in part, on an input clock signal, wherein the number N is greater than one, wherein each of the N individual control signals has a pulse width approximately equal to a pulse width of the input clock signal and has a duty cycle of approximately 1/N times 100 (1/N*100) percent;
a mixer, coupled to the control block, to generate a mixer output signal based, at least in part, on the input clock signal and the reference signal; and
an N-path filter, coupled to the mixer and the control block, to filter the mixer output signal and to generate a filter output signal based, at least in part, on the filter control signal, the N-path filter comprising:
N capacitors and 2N (2*N) switch devices to selectively couple the N capacitors between an input of the N-path filter and an output of the N-path filter in response to the respective N individual control signals.

9. The wireless device of claim 8, wherein the filter is to suppress, at least in part, signals having frequencies of approximately one-half a frequency of the input clock signal.

10. The wireless device of claim 8, wherein the filter is a notch filter to suppress a frequency band within the mixer output signal.

11. The wireless device of claim 8, further comprising:
a quadrature signal processor to receive the filter output signal and to generate a quadrature output signal having a first output signal and a second output signal, wherein the second output signal has a quadrature relationship to the first output signal.

12. The wireless device of claim 11, wherein a frequency of the first output signal and the second output signal is three-fourths (¾) a frequency of the input clock signal.

13. The wireless device of claim 8, further comprising:
a local oscillator (LO) to generate the input clock signal having a frequency that is four-thirds (4/3) of a frequency of a quadrature output signal.

14. A method to generate a quadrature signal, the method comprising:
generating, by a control block, a filter control signal and a reference signal, the filter control signal having a number N of individual control signals based at least in part, on an input clock signal, wherein the number N is greater than one, wherein each of the N individual control signals has a pulse width approximately equal to a pulse width of the input clock signal and has a duty cycle of approximately 1/N times 100 (1/N*100) percent;
generating by a mixer, a mixer output signal based, at least in part, on the input clock signal and the reference signal; and
filtering, by an N-path filter, the mixer output signal and generating a filter output signal based, at least in part, on the filter control signal, the N-path filter comprising:
N capacitors and 2N (2*N) switch devices to selectively couple the N capacitors between an input of the N-path filter and an output of the N-path filter in response to the respective N individual control signals.

15. The method of claim 14, further comprising:
generating a first output signal and a second output signal based, at least in part, on the filter output signal, wherein the second output signal has a quadrature relationship to the first output signal.

* * * * *